United States Patent [19]

Suzuki

[11] Patent Number: 4,989,263
[45] Date of Patent: Jan. 29, 1991

[54] RADIO RECEIVER WITH AUTOMATIC MODE CHANGEOVER CIRCUIT

[75] Inventor: Mitsuhiro Suzuki, Tokyo, Japan

[73] Assignee: Sony Corporation, Tokyo, Japan

[21] Appl. No.: 234,143

[22] Filed: Aug. 19, 1988

[30] Foreign Application Priority Data

Aug. 26, 1987 [JP] Japan .................................. 62-211635

[51] Int. Cl.$^5$ .......................................... H04B 17/00
[52] U.S. Cl. .................................... 455/182; 455/184; 455/226; 455/260
[58] Field of Search ............ 455/33, 67, 182, 183–184, 455/192, 226, 134, 135, 260

[56] References Cited

U.S. PATENT DOCUMENTS

| 4,069,455 | 1/1978 | Sherman, Jr. | 455/226 |
| 4,619,002 | 10/1986 | Thro | 455/33 |
| 4,704,734 | 11/1987 | Menich et al. | 455/33 |
| 4,868,885 | 9/1989 | Perry | 455/226 |

FOREIGN PATENT DOCUMENTS 1572207 3/1978 United Kingdom .
2079565 6/1981 United Kingdom .

Primary Examiner—Reinhard J. Eisenzopf
Assistant Examiner—Andrew Faile
Attorney, Agent, or Firm—Lewis H. Eslinger; Jay H. Maioli

[57] ABSTRACT

A radio wave receiver has a signal generator for generating a binary code signal indicative of the level of electric field intensity of a received radio wave. The binary code signal is fed to an up/down counter for increasing its counted value by M (M is a positive integer) when the binary code signal indicates a "strong" electric field and decreasing its counted value by N (N is a positive integer) when the binary code signal indicates a "weak" electric field. The contents of the up/-down counter are evaluated to determine whether a change-over to another mode of operation or broadcast station is effected or not in accordance with the count value of the counter.

7 Claims, 3 Drawing Sheets

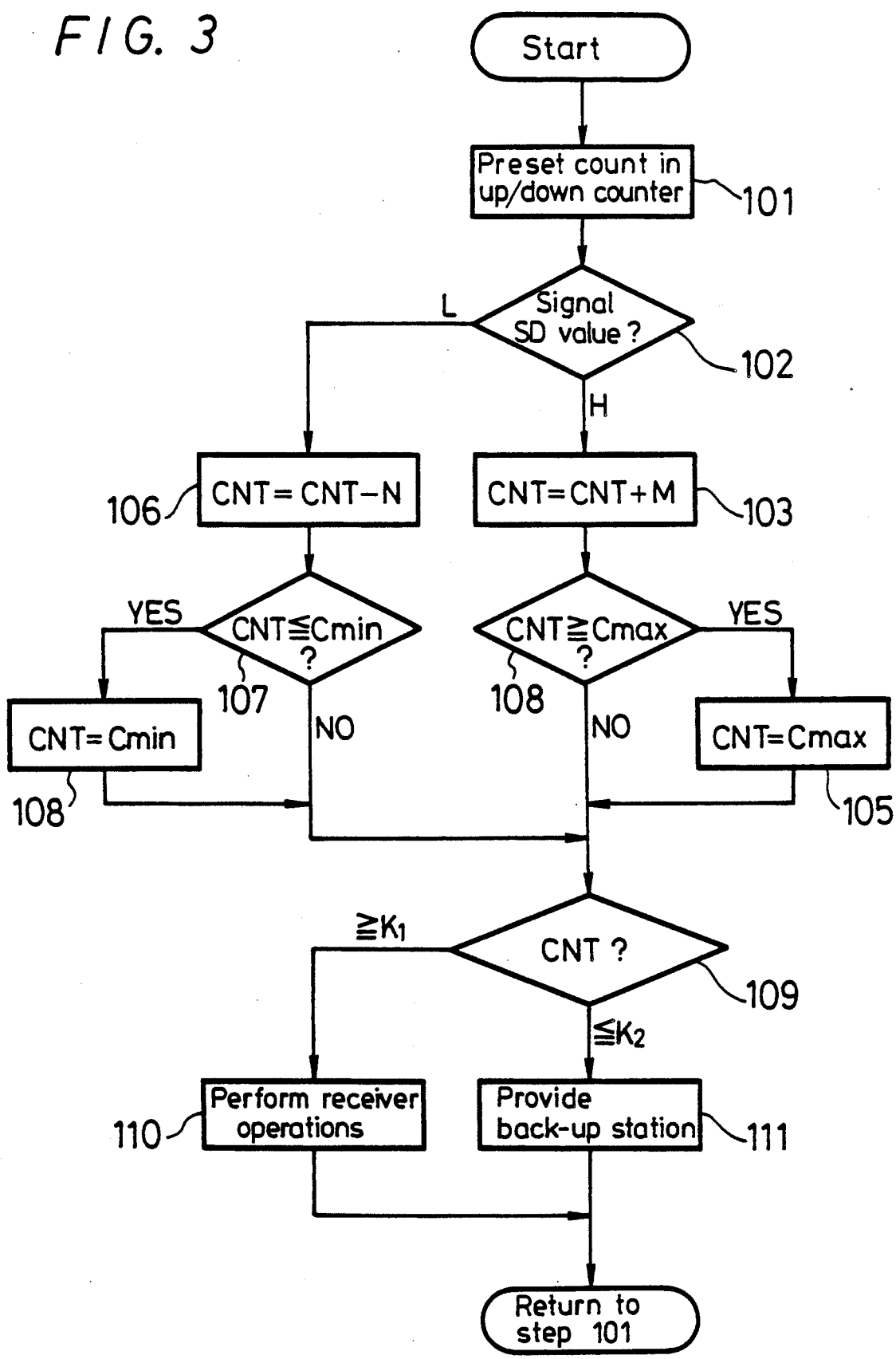

RADIO RECEIVER WITH AUTOMATIC MODE CHANGEOVER CIRCUIT

BACKGROUND OF THE INVENTION

1. Field of the Invention

This invention relates generally to a radio wave receiver and, more particularly, to radio receiver including a circuit for detecting the electric field intensity of a received radio wave.

2. Description of the Background

Conventionally, the process of detecting signal strength, that is, the intensity of a received electric field in a tuner is carried out by comparing a signal corresponding to the electric field intensity of the received signal or audio wave to a predetermined threshold value to derive an indicator signal. Because it is generally sufficient for the tuner to indicate only whether the received signal is visible and audible or not, it is not necessary to detect the absolute level of the intensity of the electric field of the received signal.

In one example of such a receiver signal strength indicator, intermediate frequency (IF) carrier components are rectified to derive a direct current (DC) voltage that is compared with a threshold value to obtain a binary signal as a comparison result. It can then be determined from the level of the binary signal that the electric field intensity is high, if the direct current voltage is larger than the threshold value, and low, if the direct current voltage is smaller than the threshold value. This approach can be used, for example, in an automobile radio receiver and tape player to change-over to the radio receiver when the electric field intensity of the received broadcast signal is high, that is, when the binary signal is at a high level and to change over to the tape player for listening to a tape when the electric field intensity of the received broadcast signal is low, that is, when the binary signal is at a low level.

In the above-mentioned system for detecting the electric field intensity of a received signal by using a binary signal of high and low levels, if it is assumed that an auto radio receiver is receiving a broadcast signal from a certain broadcasting station while the car is moving in a direction away from this broadcasting station, the electric field intensity of the received broadcast signal will change in some fashion, for example, as shown in FIG. 1A. In such case, even though the electric field intensity is high, if the car passes in front of a high building, the electric field intensity will instantaneously become lower, as shown in FIG. 1A at a time $t_1$. Thus, the binary signal moves from the high level to the low level, as shown in FIG. 1B, to consequently halt the operation of the receiver and change-over to the tape player in response to this transition of the binary signal caused by the large building. Subsequently, at some time $t_2$, when the car has passed the large building, the binary signal will again go high thereby to change over once again and resume operation of the receiver.

In another situation, when the electric field intensity becomes lower and the signal moves from a high electric field intensity to the vicinity of the threshold level, there is a tendency that noise will increase relative to the signal with the lowered electric field intensity. As a result, the electric field intensity varies readily between higher and lower values relative to the threshold level, as shown in the time period between times $t_3$ and $t_{11}$ in FIG. 1A, so that the binary signal correspondingly moves frequently and hence it it difficult to remain set at one of the high and low levels. In other words, the system appears unstable.

In a different situation, an FM multiplex system called Radio Data System (RDS) is planned to be introduced in Europe. In the RDS system a subcarrier of 57 kHz is provided above the FM base band for multiplexing approximately 1.2 kbps of digital information as a two-phase phase-shift keying (PSK) signal. One use for this RDS signal is to transmit data identifying another broadcasting station which is transmitting the same program at the same time, of course, the tuning value is offset from the broadcasting station presently tuned. More than one such station could be identified.

It is therefore possible to automatically tune to one of the other broadcasting stations by the use of the above-mentioned RDS data if a receiving condition becomes worse in a radio receiver mounted in a travelling body such as a car, thereby to maintain the same program information being presented to the listener.

With this function, the timing of changing over from one broadcasting station to another may be determined by detecting the electric field intensity of the broadcasting signal presently being received.

Assuming that the above-described discriminating method using the binary signal is employed for the detection of the electric field intensity, it is probable that the electric field intensity will be instantaneously lowered, or the electric field intensity will be varied in the vicinity of the threshold level, to frequently change-over the receiver to the frequency of the other broadcasting station, so that a beat may be generated every time the change-over is effected or the volume may suddenly be increased if the electric field of the signal being transmitted from the newly acquired broadcasting station is too strong. If such noises occur frequently, the listening conditions will be intolerable for travellers in the car.

Alternatively, if the absolute value of the electric field intensity of a received signal is digitized and employed for electric field discrimination, the above-mentioned problem could be eliminated. Nevertheless, because such digital data would require multiple bits for example, 8 bits, the circuit for discriminating such multiple bit data would be complicated and expensive.

OBJECTS AND SUMMARY OF THE INVENTION

Accordingly, it is an object of the present invention to provide a receiver that can eliminate the above-noted defects inherent in the prior art.

It is another object of the present invention to provide a receiver that is capable of eliminating the above-mentioned defect and that can satisfactorily discriminate the electric field intensity of the received signal even in the vicinity of the threshold value by using a binary code signal.

To achieve the above objects, the present invention provides a receiver having an automatic change-over function that comprises a generator for generating a binary code signal indicative of a level of the electric field intensity of a received radio wave; an up/down counter for increasing its counted value by M (M is a positive integer) when the binary code signal s at one level and decreasing its counted value by N (N is a positive integer) when the binary code signal is at another level; and a circuit for determining whether a change-over operation should be effected or not based upon the counted value of the counter means.

These and other objects, features, and advantages of the present invention will become apparent from the following detailed description of the preferred embodiment taken in conjunction with the accompanying drawings, through which like reference numerals designate like elements and parts.

BRIEF DESCRIPTION OF THE DRAWINGS

FIG. 3 is a flow chart representing the operation of the electric field intensity discriminator shown in FIG. 2.

DETAILED DESCRIPTION OF THE PREFERRED EMBODIMENT

Figure 2:
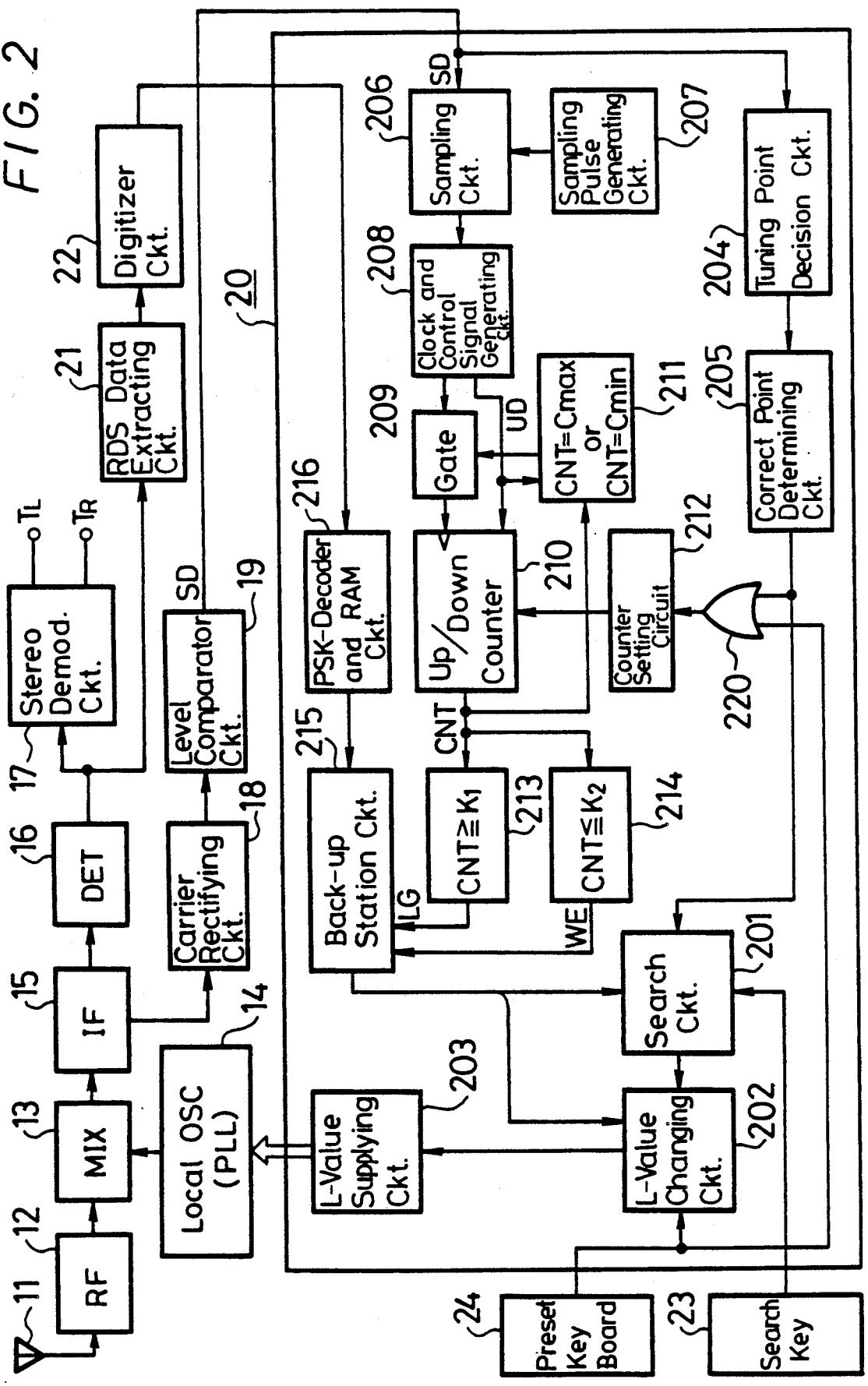
FIG. 2 is a schematic in block diagram form of an FM radio receiver according to an embodiment of the present invention.

FIG. 2 is a block diagram representation of an FM synthesizer tuner mounted in a car and capable of receiving RDS signals, in which the present invention is implemented. A radio wave received by an antenna 11 is supplied through a radio wave frequency (RF) tuning circuit 12 to a mixer 13 wherein it is multiplied with a local oscillator signal from a local oscillator circuit 14 to thereby frequency-convert the carrier frequency. The output from mixer 13 is supplied to an intermediate frequency (IF) amplifier circuit 15 having an intermediate frequency filter to generate an intermediate frequency (IF) signal of 10.7 MHz. This intermediate frequency signal is fed to a detecting circuit 16 to be FM-detected, and the detected signal is supplied to a stereo demodulating circuit 17, from which a left-channel audio signal is delivered to a left-channel audio output terminal $T_L$ and a right-channel audio signal is delivered to a right-channel audio output terminal $T_R$.

In this embodiment, local oscillator circuit 14 is formed in a phase-locked loop (PLL) configuration and is supplied with a control signal from a microcomputer 20 in the form of a value L for determining the frequency dividing ratio 1/L of a variable frequency divider for changing its oscillating output frequency. Microcomputer 20, is advantageously implemented by a model M50740 manufactured by Mitsubishi Electric Corporation. The respective blocks making up microcomputer 20 of FIG. 2 are functional blocks indicating various functions that are executed by microcomputer 20.

Figure 1:
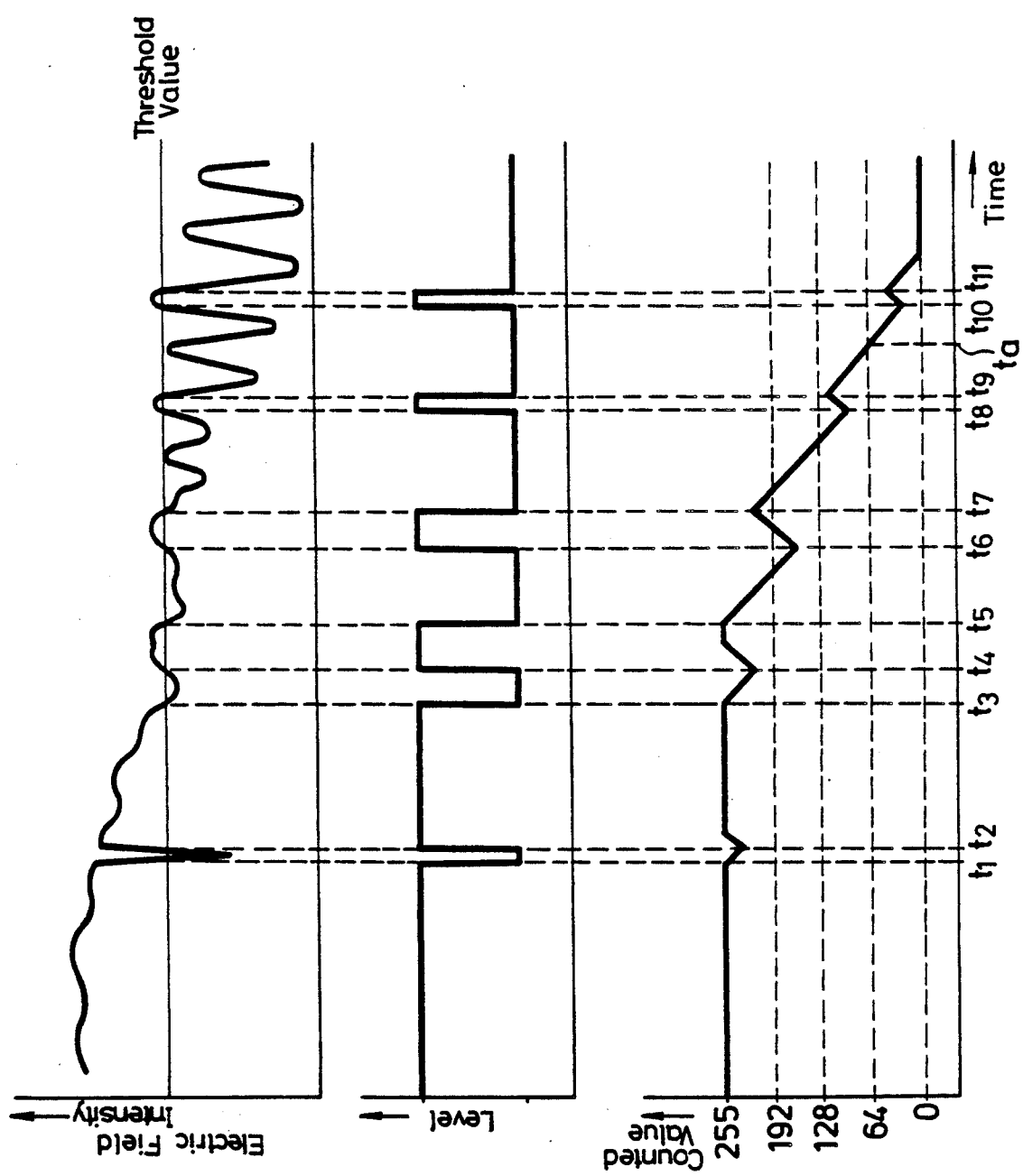
FIGS. 1A-1C are graphic representations useful in explaining the present invention.

The binary code signal indicative of an electric field intensity of the received radio wave is generated as follows. If it is assumed that the electric field intensity received by the receiver changes as shown in FIG. 1A, then intermediate frequency carrier components from intermediate frequency amplifier circuit 15 ar supplied to a carrier rectifying circuit 18 to be converted to a direct current signal, which is supplied to a level comparator circuit 19 to be compared with a predetermined threshold level that is preset in the comparator. Comparator circuit 19 derives a binary code signal SD that has a high level when the direct current signal is above the threshold level and that has a low level when the direct current signal is below the threshold level. FIG. 1B shows a representation of binary code signal SD. The binary code signal thus derived is supplied to microcomputer 20.

The output from detecting circuit 16 is also fed to an RDS data extracting circuit 21 that may comprise, for example, a band-pass filter to extract therefrom the RDS data which is supplied to a digitizer circuit 22 to be converted to digital data which is next supplied to microcomputer 20.

In this embodiment, microcomputer 20 has an auto-tuning function, in which microcomputer 20 is provided with a search circuit 201, an L-value changing circuit 202 which is driven by the search circuit 201 and an L-value supplying circuit 203 for supplying the variable frequency divider in local oscillator circuit 14 with an L value. L-value supplying circuit 203 comprises a read only memory (ROM) loaded with a plurality of L values for receiving radio waves within the FM band at 100 kHz intervals and a read address circuit for reading one of the L values from the ROM. The L-value changing circuit 202 supplies the address circuit of the L-value supplying circuit 203 with a command signal.

When a search key 23 is depressed, search circuit 201 drives the L-value changing circuit 202 to sequentially read out the L values from the L-value supplying circuit 203 and supply the read-out L values to the variable frequency divider in local oscillator circuit 14. Thus, the local oscillation frequency thereof is sequentially changed to search for broadcasting stations.

In the present embodiment, the binary code signal SD is also utilized to detect whether a broadcasting radio wave exists or not. Specifically, the signal SD fed to microcomputer 20 is supplied to a tuning point deciding circuit 204 that decides whether there is a tuning point based on whether the signal SD indicates a high electric field intensity. The decided result thereof is supplied to a correct point determining circuit 205 which supplies search circuit 201 with a control signal. Search circuit 201 supplies the L-value changing circuit 202 with an L-value change stop signal in response to the control signal from correct point determining circuit 205, to thereby determine a correct point.

The present embodiment is also provided with a preset selection function, so that when a desired preset key on a preset key board 24 is depressed, an L value corresponding to the depressed preset key is supplied from the L-value supplying circuit 203 to the local oscillator circuit 14 by L-value changing circuit 202 to thereby select the station at the corresponding frequency.

Next, the operation for determining whether the receiver is in a receiving state or is to start a search operation is described, in which case the signal SD is supplied to a sampling circuit 206 to be sampled by a sampling pulse SP from a sampling pulse generating circuit 207. In this embodiment the cyclic period of the sampling pulse SP is chosen to be, for example, 17 msec, and the signal SD is continuously sampled.

The sampled output from sampling circuit 206 is supplied to a signal generating circuit 208 for generating clock and up/down control signals. When the sampling output is at the high level, as required at times $t_2$, $t_4$, $t_6$, $t_8$ and $t_{10}$ in FIG. 1A, signal generating circuit 208 generates M (M is a positive integer) clock signals and the up/down control signal UD having a state (1) that commands an up/down counter 210 to count upward.

On the other hand, when the sampling output is at low level, as required at times $t_1$, $t_3$, $t_5$, $t_7$, $t_9$ and $t_{11}$ in FIG. 1A, generating circuit 208 generates N (N is a positive integer) clock signals and the up/down control signal UD having a state (0) that commands up/down counter 210 to count downward. The clock signal from signal generating circuit 208 is fed to a clock terminal of up/down counter 210 through a gate 209, however, the up/down control signal is fed directly to a count direction control terminal of up/down counter 210.

The above values of M and N may be arbitrarily selected and need not be equal, however, they are assumed to both be equal to two in the present embodiment (M=N=2).

An output signal CNT indicative of the counted value from up/down counter 210 is fed to a maximum/minimum value detecting circuit 211, which is also supplied with the up/down control signal UD from signal generating circuit 208. Maximum/minimum detecting circuit 211 supplies gate 209 with a gate signal GT, so that gate 209 is opened by the gate signal GT when the counted value CNT is between a predetermined maximum value, for example, 255, and a predetermined minimum value, for example, 0. In other words, the following equation is established:

$$Cmax \geq CNT \geq Cmin$$

If the counted value CNT reaches the maximum value Cmax=255 while up/down counter 210 is counting upward, gate 209 is closed by the gate signal GT. It will be appreciated that up/down counter 210 stops its counting operation with the output CNT at 255, even though the counted value would exceed 255. In this condition, if the signal UD is changed from the count-up state to the count-down state, gate 209 is opened and up/down counter 210 starts counting clock pulses downward, that is, decrementing its count.

In the same manner, if the counted value CNT reaches the predetermined minimum value Cmin=0 while the counter 210 is still counting downward, gate 209 is closed by the gate signal GT. Thus, up/down counter 210 stops its counting operation with the output CNT being 0, even though the counted value would go below 0. In this condition, if the signal UD is changed from the count-down state to the count-up state, gate 209 is opened and counter 210 starts increasing its count by counting clock pulses upward.

If the binary code signal SD goes low in level, such as at the times $t_7$, $t_9$, and $t_{11}$ of FIG. 1B, when up/down counter 210 is counting upward and the counted output CNT is below the maximum value Cmax=255, the output value CNT of up/down counter 210 begins to decrement from the already counted value at the times $t_7$, $t_9$, and $t_{11}$.

On the other hand, if the binary code signal SD goes high in level, such as at the times $t_2$, $t_4$, $t_6$, $t_8$, and $t_{10}$ of FIG. 1B, where the counter 210 is counting downward and the counted value CNT is above the minimum value Cmin=0, the output value CNT of up/down counter 210 begins to increment from the already counted value at the respective time points.

When preset key 24 is depressed, or if the frequency of a broadcasting station is fixed by the correct point determining circuit 205, which precisely determines a tuning point as determined by an OR gate 220, a counter setting circuit 212 sets the up/down counter 210 to a predetermined value.

If the receiver is in a condition for receiving broadcast radio waves and its power supply is turned off and then turned on again to receive the same broadcasting radio wave, up/down counter 210 is set to a predetermined value of 192. If the receiver is not receiving a broadcasting radio wave, the counter 210 is set to a predetermined value of 128. In other words, when the frequency of a broadcasting station to be received is newly fixed, up/down counter 210 starts counting upward or downward in accordance with the signal SD, with the above set predetermined values as initial values. The signal SD is continuously sampled at 17 msec intervals as described above and up/down counter 210 continuously performs the above-mentioned counting operation until its maximum or minimum points are reached.

It should be understood from the above explanation that when the received electric field is strong and relatively stable, the signal SD is always at the high level so that the counted value output CNT from up/down counter 210 will always show the maximum value Cmax=255, whereas when the received electric field is very weak, the signal SD is always at the low level so that the counted value output CNT will always show the minimum value Cmin=0. Such operation is represented in FIG. 1C.

When the electric field intensity of a received radio wave is in the vicinity of the threshold level, the signal SD becomes unstable, so that the counted value output CNT of up/down counter 210 takes some intermediate value between the values Cmax and Cmin. If the probability of the high and low levels of the signal SD in the vicinity of the threshold level is expressed by N:M, an equation $M \times N + (-N) \times M = 0$ is established, and, accordingly, the counted value CNT is not increased or decreased uniformly.

When the electric field is stronger than the above threshold condition, the probability that the signal SD will be at the high level increases, with the result that the counted value CNT tends to be incremented upwardly. On the other hand, when the electric field is weaker than the above threshold condition, the probability of the signal SD being at the low level increases, so that the counted value CNT tends to be decremented downwardly. It is therefore possible to judge from the actual count value CNT whether the receiver is in a proper receiving condition or to start a searching operation when the count is between the maximum and minimum values.

The counted value CNT is supplied to a first comparator circuit 213 and a second comparator circuit 214, so that first comparator circuit 213 compares the output CNT with a set value $K_1$, and second comparator circuit 214 compares the output CNT with another set value $K_2$. The values $K_1$ and $K_2$ are assumed to satisfy a relationship expressed by $Cmax > K_1 \geq K_2 > Cmin$. In this particular embodiment, $K_1$ is set to 192 and $K_2$ to 64. First comparator 213 produces an output LG indicating that the change-over operation is not performed, that is, there is a proper receiving condition present when the output CNT is more than or equal to 192 (CNT 192). Second comparator 214 produces an output WE indicating that change-over operation must be performed, that is, a search operation for another broadcasting station must take place when the output CNT is less than or equal to 64 (CNT 64).

Referring again to FIGS. 1A-1C, when the electric field intensity is changing, as shown in FIG. 1A, up/down counter 210 is counting downward. FIG. 1C represents the count in up/down counter 210. Thus, the output CNT of up/down counter 210 arrives at CNT 64 at some time ta, and the output WE is derived for the first time for commencing the change-over operation. Although the signal SD is at the low level at time periods $t_1-t_2$, $t_3-t_4$, $t_4-t_5$, and $t_7-t_8$ before time ta, the output CNT from the counter 210 is still more than 64 (CNT 64), so that the output WE for instructing the change-over operation cannot be produced.

The outputs LG and WE thus derived are next supplied to a back-up station circuit 215 that provides the back-up broadcast stations currently transmitting the same program as the signal being received.

The RDS data supplied from digitizer circuit 22 to microcomputer 20 is two-phase PSK demodulated or decoded in a memory circuit 216 comprising a decoder and a RAM, whereby information concerning broadcast stations that are currently transmitting the same program, more particularly, information on the offset values from the currently received broadcasting station, is derived and supplied to back-up station circuit 215. Back-up station 215 determines that he receiver is receiving a broadcast radio wave when the output LG is received and then provides the list of broadcasting stations transmitting the same program on the basis of information that has been decoded and stored in PSK decoder and RAM circuit 216. When the output WE is derived from second comparator 214, back-up station circuit 215 supplies search circuit 201 with a command signal for starting a search operation, and L-value changing circuit 202 is supplied with the offset information on the nearest station from the currently received station on the basis of the list of the broadcasting stations transmitting the same program, as decoded from the RDS signal in PSK decoder and RAM circuit 216. Thus, the receiver starts searching for the other nearest broadcasting station that is transmitting the same program and can tune to same within a relatively short period of time.

At the time the receiver changes over to the new broadcasting station, up/down counter 210 is set to 128. If the electric field intensity of the radio wave transmitted from this new broadcasting station is higher than the threshold level and, thus, the signal SD is at the high level, then up/down counter 210 starts counting upwardly. When the counter output value CNT is sufficient to satisfy CNT≧192, the receiver enters in a condition of receiving the newly selected broadcasting station in response to the output LG from first comparator 213. On the other hand, if the electric field intensity of the new broadcasting station is lower than the threshold level, so that the signal SD is at a low level, up/down counter 210 starts counting downwardly. When the counter output value CNT becomes less than or equal to 64 (CNT≦64), the output WE from second comparator 214 is supplied to back-up station circuit 215, thereby resuming the search operation for the next broadcasting station, based the offset information as stored in PSK decoder and RAM circuit 216, after a predetermined constant time period.

At the time the receiver changes over to the new broadcasting station, up/down counter 210 is set to 128. If the signal SD moves between the high and low levels at extremely short intervals and the high level and low level periods appear almost equal to each other, there is a fear that the counter value CNT will hunt in the vicinity of 128 and will not go above 192 nor below 64, thereby preventing the discrimination of a receiving condition or a search starting condition. In such case, a predetermined number of clock pulses supplied from signal generating circuit 208 to the up/down counter 210 are counted to detect the lapse of a predetermined time period. If back-up station circuit 215 is not supplied with the output LG from first comparator 213 nor the output WE from second comparator 214 during the above predetermined time period, second comparator 214 is forced to generate the output WE and supply same to back-up station circuit 215, which is thus enabled to search for yet another broadcasting station.

Thus, when information concerning broadcasting stations transmitting the same program is provided by the use of RDS data and when the electric field intensity of a radio wave currently being received gradually becomes lower due to progress of the car, the timing for changing from the currently received station to another can be precisely determined by the output from second comparator 214.

FIG. 3 is a flowchart representing the procedure of the above-described change-over operation determination as executed by microcomputer 20.

When a broadcasting station is selected and fixed, the counted value CNT of up/down counter 210 is preset as described above at step 101. Next, it is determined whether the sampled value of the signal SD is at a high or low level at step 102. When signal SD is at a high level H, the program proceeds to step 103 wherein the counted value CNT is increased by M, that is, up/down counter 210 counts upward. Next, it is detected whether the resultant counted value CNT is larger than or equal to the maximum value Cmax at step 104, if the answer is YES, then at step 105 the counted value CNT is set to Cmax. On the other hand, if the answer is NO, step 109 is proceeded to with no change being made in the counted value CNT.

Returning back to step 102, if it is detected that the sampled value of the signal SD is at a low level L, the counted value CNT is decreased by N, that is, up/down counter 210 counts downward at step 106. Next, it is detected whether the resultant counted value CNT is less than or equal to the minimum value Cmin at step 107. If the answer is YES, the counted value CNT is set to the minimum value Cmin at step 108. Alternatively, if the answer is NO, step 109 is proceeded to with no change in the counted value CNT. At step 109, the counted value CNT is compared with $K_1$ and $K_2$. If CNT≧$K_1$ stands, then in step 110 receiver operations, such as the determination of a receiving condition of the broadcast radio wave or the like, are effected. If CNT≦$K_2$ stands, then in step 111 the above-described operation of providing a back-up station broadcasting the same program is carried out. The procedure returns to step 101 after completing the operations in either step 110 or step 111.

From the preceding, it will be appreciated that a precise determination can be assured even in the vicinity of the threshold level of the binary code signal SD for determining whether the electric field intensity is high or low, and this operation can be realized by changing only the processing of signal SD, as executed by microcomputer 20, without the necessity of changing any hardware for the electric field intensity determination by using the binary code signal SD.

Additionally, the determination accuracy can be improved by extending the absolute value ↑Cmax−Cmin↑ and reducing the sampling interval of the signal SD.

According to the present invention described above, an up/down counter counts upward or downward depending upon the binary code signal that indicates the high or low level of the electric field intensity such that the electric field intensity is determined by the count value, so that exact discrimination can be assured even if the received signal intensity is in the vicinity of the receiver threshold level. Thus, the receiver according to the present invention can exactly discriminate the electric field intensity even in the case of a mobile receiver wherein the electric field intensity gradually becomes weaker due to increasing distance from the transmitter or obstacles in the signal path. When the function of providing back-up broadcasting stations that are transmitting the same program by the use of the RDS data is realized, the timing of changing over to another station is determined by the discrimination output, whereby the practical aspects of the RDS system are enhanced.

The above-described embodiment relates to a case wherein the present invention is implemented to provide back-up broadcasting stations transmitting the sam program by the use of RDS data, however, the present invention can be also applied to an ordinary automatic radio receiver for determining timing for changing over to a different station depending upon level changes of the electric field intensity of the signal being received.

The above description is given on a single preferred embodiment of the invention but it will be apparent that many modifications and variations could be effected by one skilled in the art without departing from the spirit or scope of the novel concepts of the invention, which should be determined only by the appended claims.

What is claimed is:

1. A receiver having an automatic mode change-over function, comprising:
   means for generating a binary code signal indicative of the level of electric field intensity of a received radio wave;
   sampling circuit means receiving said binary code signal for sampling same in response to a sampling pulse from a sampling pulse generating circuit;
   up/down counter means;
   means for detecting maximum and minimum count values in said up/down counter;
   means for increasing a counted value in said up/down counter means by M (M is a positive integer) when said binary code signal is at one level and decreasing a counted value in said up/down counter means by N (N is a positive integer) when said binary code signal is at the other level;
   gate circuit means responsive to said means for detecting for gating a signal from said means for increasing and decreasing to said up/down counter;
   means for detecting whether a change-over operation is to be effected in accordance with the count value of said up/down counter means; and
   means for setting said up/down counter at a midpoint between said maximum and minimum count values upon effecting a change-over operation.

2. A receiver according to claim 1 further comprising means for determining a correctly received radio wave.

3. A receiver according to claim 1, wherein said sampling pulse generating circuit procedures said sampling pulses with a period of 17 milliseconds.

4. A receiver according to claim 1, wherein said means for determining includes first and second comparator means receiving the count value in said up/down counter for determining when said count value lies between respective upper and lower values, so that a correctly received radio wave is declared when said count value lies therebetween.

5. A receiver having an automatic mode change-over function for changing between two operation modes, comprising:
   means for generating a signal having one of two possible levels in response to the level of electric field intensity of a received radio wave;
   sampling means including a sampling circuit for sampling said signal from said means for generating in response to sampling pulses from a sampling pulse generating circuit;
   up/down counter means;
   means for increasing a counted value in said up/down counter means by M (M is a positive integer) when said signal is at a high level and decreasing a counted value in said up/down counter means by N (N is a positive integer) when said signal is at a low signal;
   count limit setting means connected to said up/down counter means and said means for increasing and decreasing for setting maximum and minimum count value limits in said up/down counter means;
   means for determining whether a mode change-over is to be effected in accordance with the count value of said up/down counter means.

6. A receiver according to claim 5, wherein said sample pulse generating circuit produces said sampling pulses with a period of 17 milliseconds.

7. A receiver according to claim 5, wherein said means for determining includes first and second comparator means receiving the count value in said up/down counter for determining when said count value lies between respective upper and lower values, so that a correctly received radio wave is declared when said count value lies therebetween.

* * * * *

UNITED STATES PATENT AND TRADEMARK OFFICE
CERTIFICATE OF CORRECTION

PATENT NO. : 4,989,263
DATED      : January 29, 1991
INVENTOR(S): Mitsuhiro Suzuki It is certified that error appears in the above-identified patent and that said Letters Patent is hereby corrected as shown below:

Col. 2, line 65, change "s" to --is--

Col. 3, line 46, after "20" delete ","

line 57, change "ar" to --are--

Col. 9, line 17, change "sam" to --same--

Col. 10, line 1, change "detecting" to --determining-- line 10, change "procedures" to --produces--

Signed and Sealed this

Sixth Day of October, 1992

Attest:

DOUGLAS B. COMER

*Attesting Officer*     *Acting Commissioner of Patents and Trademarks*